US010483377B2

(12) United States Patent
Zang et al.

(10) Patent No.: US 10,483,377 B2
(45) Date of Patent: Nov. 19, 2019

(54) DEVICES AND METHODS OF FORMING UNMERGED EPITAXY FOR FINFET DEVICE

(71) Applicant: GLOBALFOUNDRIES Inc., Grand Cayman (KY)

(72) Inventors: Hui Zang, Guilderland, NY (US); Bingwu Liu, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/821,091

(22) Filed: Nov. 22, 2017

(65) Prior Publication Data

US 2018/0097089 A1 Apr. 5, 2018

Related U.S. Application Data

(62) Division of application No. 14/735,283, filed on Jun. 10, 2015, now Pat. No. 9,853,128.

(51) Int. Cl.
*H01L 29/66* (2006.01)
*H01L 29/78* (2006.01)

(52) U.S. Cl.
CPC ...... *H01L 29/66795* (2013.01); *H01L 29/785* (2013.01); *H01L 29/7848* (2013.01); *H01L 29/66545* (2013.01)

(58) Field of Classification Search
CPC ............. H01L 29/165; H01L 29/66795; H01L 29/7848; H01L 29/785; H01L 21/26506; H01L 29/41783; H01L 29/66628; H01L 21/31111; H01L 21/76224; H01L 21/84; H01L 27/1211; H01L 29/045; H01L 29/0649; H01L 29/0847; H01L 29/6653; H01L 29/6656; H01L 29/66545
See application file for complete search history.

(56) References Cited

U.S. PATENT DOCUMENTS

| | | | |
|---|---|---|---|
| 9,048,317 B2 * | 6/2015 | Wann | ..................... H01L 29/785 |
| 9,397,219 B2 | 7/2016 | Kim | |
| 2013/0248999 A1 | 9/2013 | Glass | |
| 2014/0042500 A1 * | 2/2014 | Wann | ................ H01L 29/41791 |
| | | | 257/288 |
| 2014/0299934 A1 * | 10/2014 | Kim | ..................... H01L 29/7848 |
| | | | 257/347 |
| 2015/0104918 A1 * | 4/2015 | Liu | ................... H01L 29/42392 |
| | | | 438/283 |
| 2015/0303118 A1 | 10/2015 | Wang | |
| 2016/0343707 A1 * | 11/2016 | Kim | ..................... H01L 27/0886 |

* cited by examiner

*Primary Examiner* — Mark W Tornow
*Assistant Examiner* — Priya M Rampersaud
(74) *Attorney, Agent, or Firm* — Thompson Hine LLP; Francois Pagette

(57) ABSTRACT

Devices and methods of growing unmerged epitaxy for fin field-effect transistor (FinFet) devices are provided. One method includes, for instance: obtaining a wafer having at least one source, at least one drain, and at least one fin; etching to expose at least a portion of the at least one fin; forming at least one sacrificial gate structure; and forming a first layer of an epitaxial growth on the at least one fin. One device includes, for instance: a wafer having at least one source, at least one drain, and at least one fin; a first layer of an epitaxial growth on the at least one fin; at least one second layer of an epitaxial growth superimposing the first layer of an epitaxial growth; and a first contact region over the at least one source and a second contact region over the at least one drain.

15 Claims, 8 Drawing Sheets

DEVICES AND METHODS OF FORMING UNMERGED EPITAXY FOR FINFET DEVICE

FIELD OF THE INVENTION

The present invention relates to semiconductor devices and methods of fabricating semiconductor devices, and more particularly, to devices and methods of forming unmerged epitaxy for fin field-effect transistor (FinFet) device.

BACKGROUND OF THE INVENTION

Contact resistance is one of the device characteristics of semiconductor device performance for complementary metal oxide semiconductor (CMOS) technology, especially in FinFet devices. Larger epitaxial growth structure is desirable for decreased resistance and increased direct flow of current. In order to control the epitaxial growth process, an unmerged scheme is used, which limits the height of epitaxial growth structure. Achieving CMOS devices with taller fins also creates problems with epitaxial growth structure. Middle of line trench silicide reactive ion etch process is a key process device performance. However, current 14 nm process of record shows contact gauging effect in epitaxial substrate to significantly degrade series resistance. Therefore, it may be desirable to develop methods for achieving a more uniform and merged epitaxial growth.

BRIEF SUMMARY

The shortcomings of the prior art are overcome and additional advantages are provided through the provision, in one aspect, a method that includes, for instance: obtaining a wafer having at least one source, at least one drain, and at least one fin; etching to expose at least a portion of the at least one fin; and forming a first layer of an epitaxial growth on the at least one fin.

In another aspect, a device is provided which includes, for instance: a wafer having at least one source, at least one drain, and at least one fin; a first layer of an epitaxial growth on the at least one fin; at least one second layer of an epitaxial growth superimposing the first layer of an epitaxial growth; and a first contact region over the at least one source and a second contact region over the at least one drain.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, including fin field-effect transistor (FinFet) devices, which provide advantages over the above noted, existing semiconductor devices and fabrication processes. Advantageously, the integrated circuit device fabrication processes disclosed herein provide for semiconductor devices with lower resistance and an increase in direct flow of current.

Figure 1:
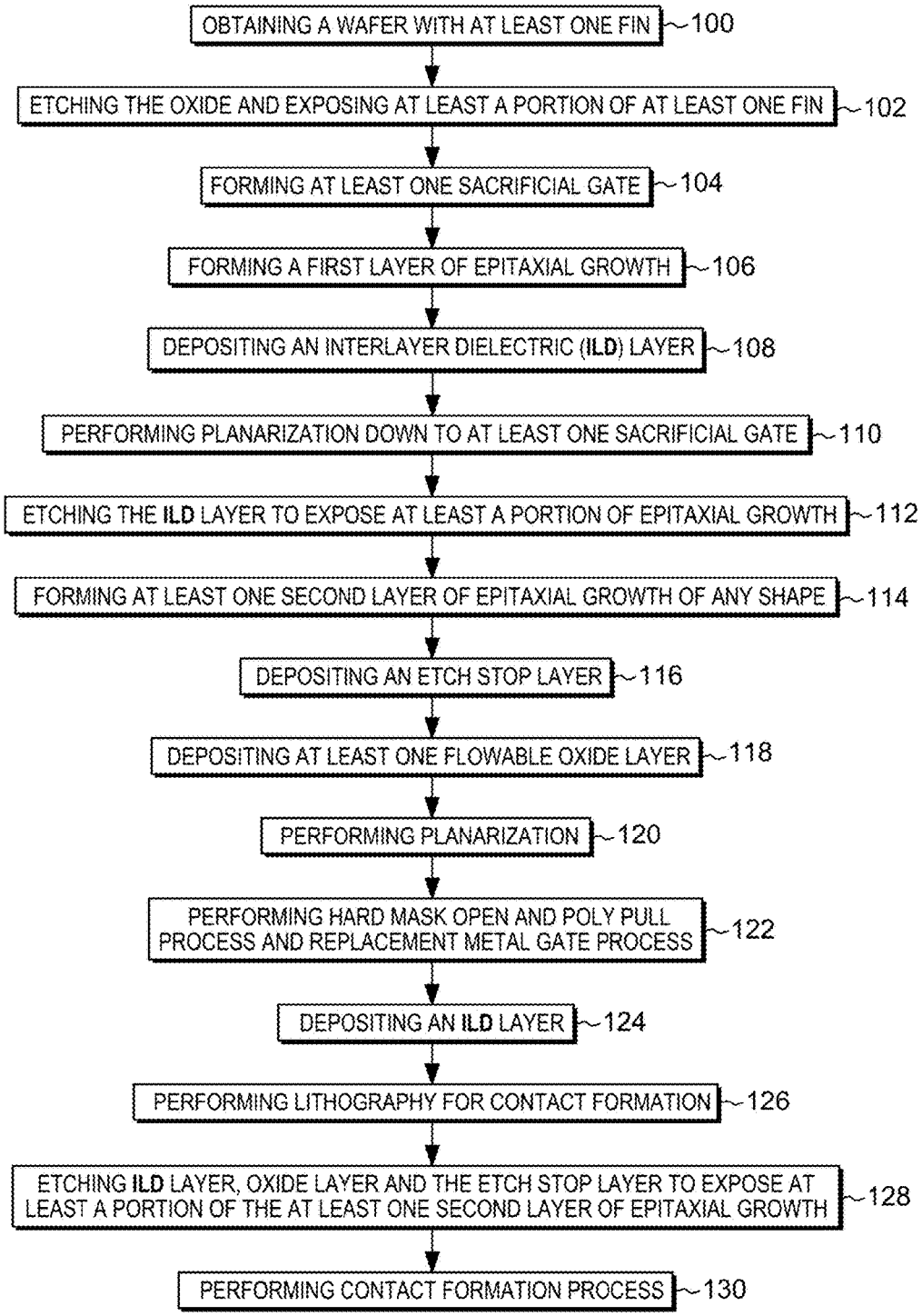
FIG. 1 depicts one embodiment of a method for forming unmerged epitaxy, in accordance with one or more aspects of the present invention.

In one aspect, in one embodiment, as shown in FIG. 1, an integrated circuit device formation process in accordance with one or more aspects of the present invention may include, for instance: obtaining a wafer with at least one fin 100; etching the oxide and exposing at least a portion of at least one fin 102; forming at least one sacrificial gate structure 104; forming a first layer of epitaxial growth 106; depositing a first interlayer dielectric (ILD) layer 108; performing planarization down to at least one sacrificial gate 110; etching the first ILD layer to expose at least a portion of the first layer of epitaxial growth 112; forming at least one second layer of an epitaxial growth 114; depositing an etch stop layer 116; depositing at least one flowable oxide layer 118; performing planarization 120; performing hard mask open and poly pull process and replacement metal gate process 122; depositing a second ILD layer 124; performing lithography for contact formation 126; etching the second ILD layer, the at least one flowable oxide layer, and the etch stop layer to expose at least a portion of the at least one second layer of an epitaxial growth 128; and performing the contact formation process 130.

FIGS. 2-10 depict, by way of example only, one detailed embodiment of a portion of the FinFet device formation process and a portion of an intermediate FinFet structure, in accordance with one or more aspects of the present invention. Note that these figures are not drawn to scale in order to facilitate understanding of the invention, and that the same reference numerals used throughout different figures designate the same or similar elements.

The FinFet device may have been processed through initial device processing steps in accordance with the design of the device being fabricated, for example, the device may include, for example, at least one source, at least one drain, and at least one fin with at least one gate structure positioned over the at least one fin. The at least one gate structure may be a sacrificial gate and may be surrounded by at least one spacer.

Figure 2:
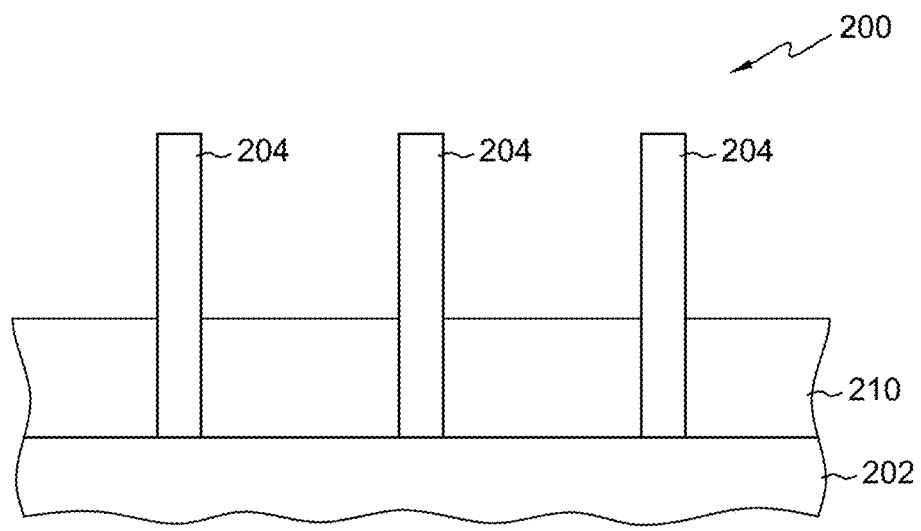
FIG. 2 depicts a cross-sectional elevational view of one embodiment of a semiconductor wafer, in accordance with one or more aspects of the present invention.

As depicted in FIG. 2, the device may include at least one fin 204 disposed on a wafer 202 and an oxide layer 210 deposited over the wafer 202. Etching may be performed over the wafer 202 to expose at least a portion of the at least one fin 204, as shown in FIG. 2. The wafer 202 may be made of, for example, a semiconductor material, e.g., silicon (Si), germanium (Ge), a compound semiconductor material, and a layered semiconductor material, with or without dopants. The device may also include at least one source region (not shown), and at least one drain region (not shown).

Figure 3:
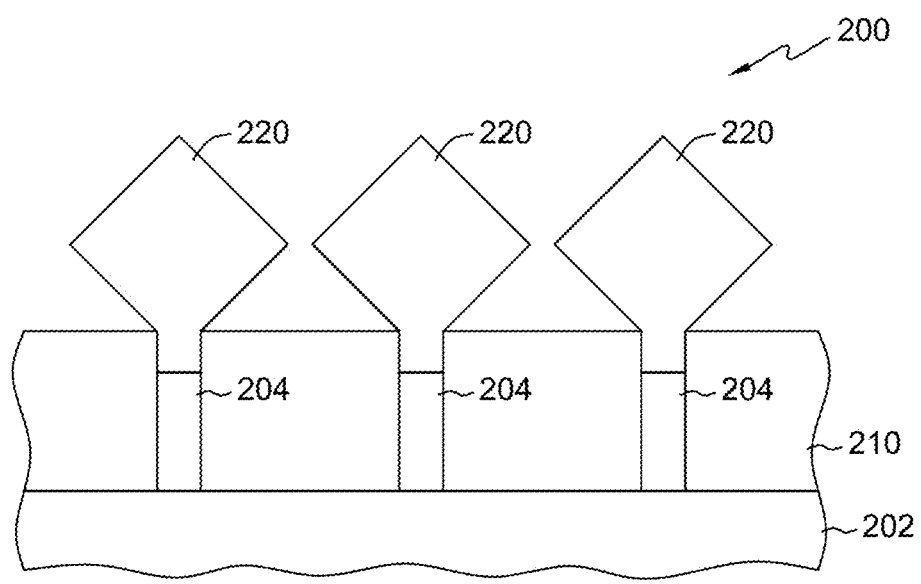
FIG. 3 depicts the structure of FIG. 2 after the at least one fin is recessed by etching and after forming a first layer of epitaxial growth, in accordance with one or more aspects of the present invention.

As depicted in FIG. 3, after etching is performed to recess the at least one fin 204, a first layer of an epitaxial growth 220 may be formed on the at least one fin 204. The shape of the epitaxy forming the first layer of an epitaxial growth 220 may be substantially a diamond shape. The first layer of an epitaxial growth 220 may be formed to promote growth vertically more than horizontally, to minimize the contact with the adjacent first layer of an epitaxial growth 220 formed on an adjacent fin 204. While the overall shape is substantially a diamond shape, the bottom portion 224 of the first layer of an epitaxial growth 220 may conform to the shape of the at least one fin 204 upon which it is formed.

Figure 4:
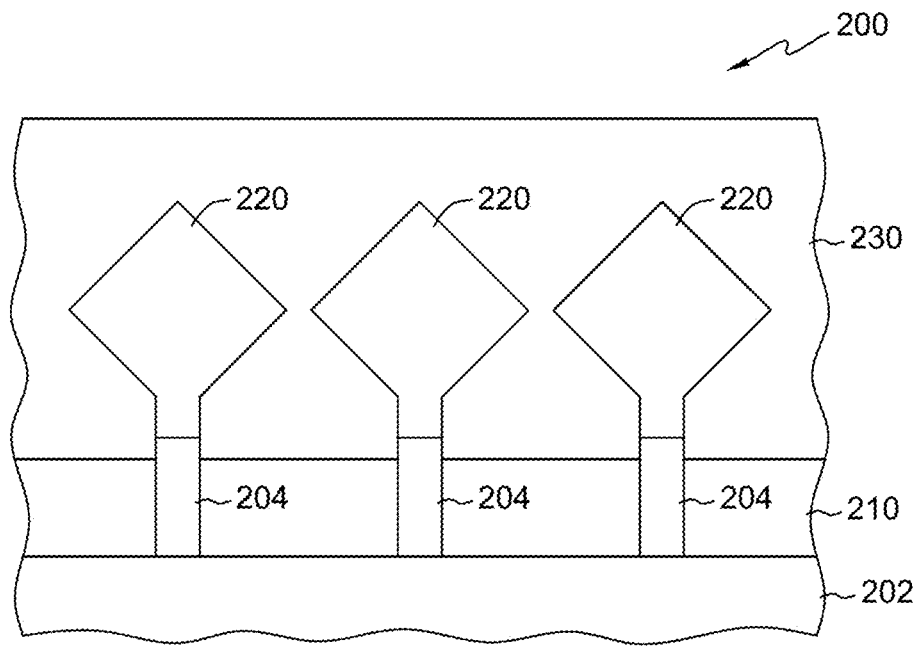
FIG. 4 depicts the structure of FIG. 3 after depositing a first interlayer dielectric layer, in accordance with one or more aspects of the present invention.

A first interlayer dielectric (ILD) layer 230 may be deposited over the wafer 202, as shown in FIG. 4. The first ILD layer 230 may be, for example, an oxide layer, i.e. $SiO_2$, or a low k dielectric material, which may be deposited using any conventional deposition process, for example, atomic layer deposition (ALD), chemical vapor deposition (CVD), or physical layer deposition (PVD).

Figure 5:
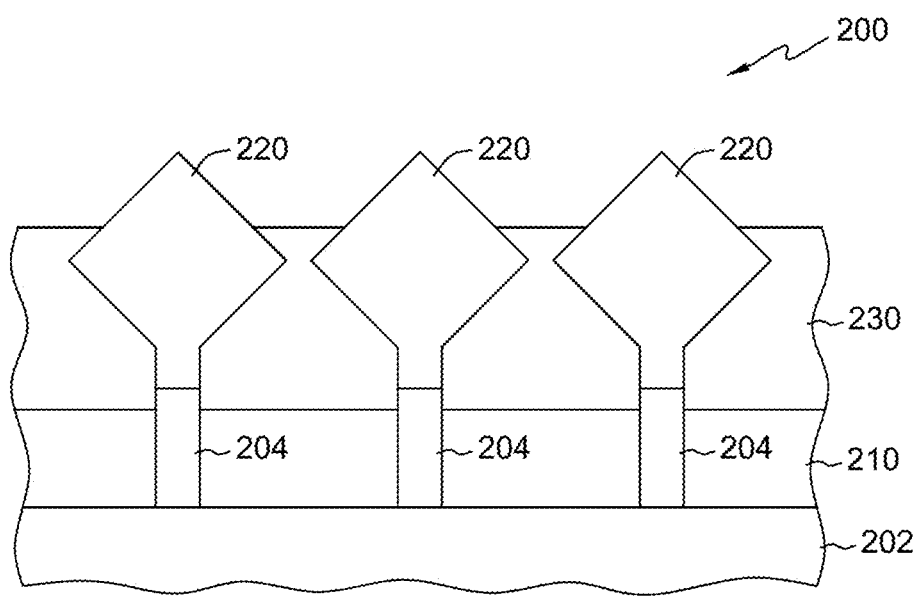
FIG. 5 depicts the structure of FIG. 4 after planarizing and etching to expose at least a portion of the first layer of epitaxial growth, in accordance with one or more aspects of the present invention.

As depicted in FIG. 5, the first ILD layer 230 may then be planarized by, for example, chemical mechanical planarization (CMP), and etching may be performed to expose at least a portion of the first layer of an epitaxial growth 220. The planarization may cause damage to the top portions of the first layer of epitaxial growths 220 (not shown). The etching process may be, for example, a wet etching, which may provide for better selectivity and may decrease the chances of damaging the epitaxial growth structures.

Figure 6:
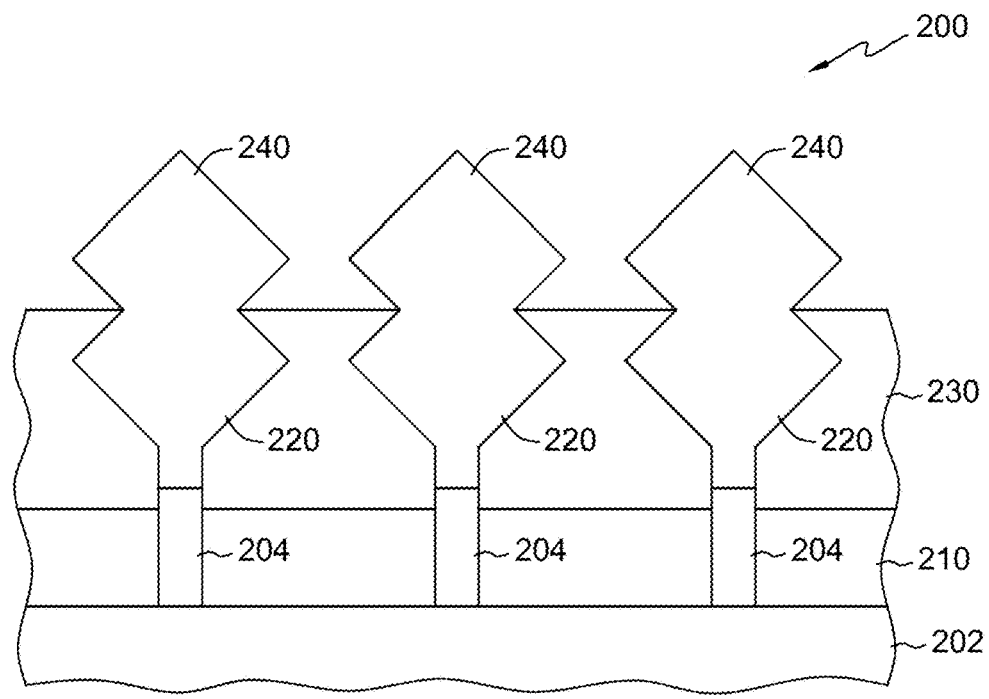
FIG. 6 depicts the structure of FIG. 5 after forming at least one second layer of epitaxial growth, in accordance with one or more aspects of the present invention.

At least one second layer of an epitaxial growth 240 may be formed on the first layer of an epitaxial growth 220, as shown in FIG. 6. The shape of the epitaxy forming the at least one second layer of an epitaxial growth 240 is not limited to a shape of a diamond, and may take a shape of, for example, a square, a rectangle, a pentagon, a trapezoid, or any polygon. In some embodiments, the at least one second layer of an epitaxial growth 240 may be of a different size than the first layer of an epitaxial growth 220, provided that the at least one second layer of an epitaxial growth 240 is not in contact with adjacent epitaxial growths 220, 240.

Figure 7:
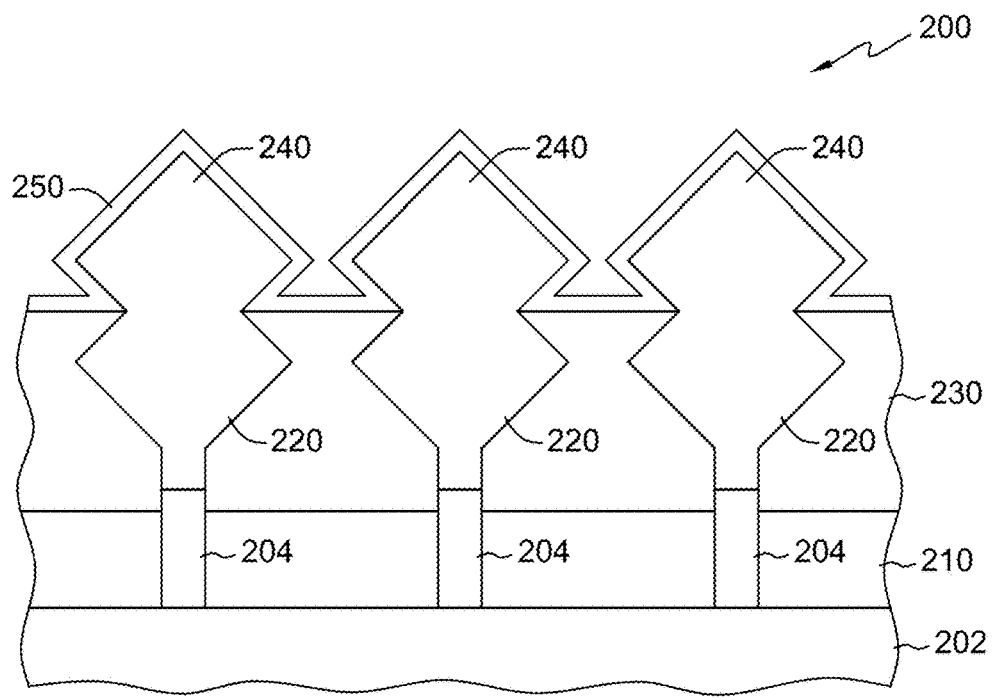
FIG. 7 depicts the structure of FIG. 6 after depositing at least one barrier layer, in accordance with one or more aspects of the present invention.

As depicted in FIG. 7, at least one barrier layer 250 may be deposited over the at least one second layer of an epitaxial growth 240 and over the first ILD layer 230. The at least one barrier layer 250 may be a contact etch stop layer, which may be, for example, comprised of silicon nitride ($Si_3N_4$) or a low k material, i.e., SiCOH. The at least one barrier layer 250 may be deposited using any conventional deposition process, for example, ALD, CVD, or PVD. The at least one barrier layer 250 may be deposited over the exposed surfaces, including over the exposed surfaces of the at least one second layer of an epitaxial growth 240 and the first ILD layer 230, so as to form a conformal layer over the at least one second layer of an epitaxial growth 240 and over the first ILD layer 230, as shown in FIG. 7. The at least one barrier layer 250 may be a thin layer of, for example, approximately 3 to 20 nm and more preferably 5 to 10 nm.

Figure 8:
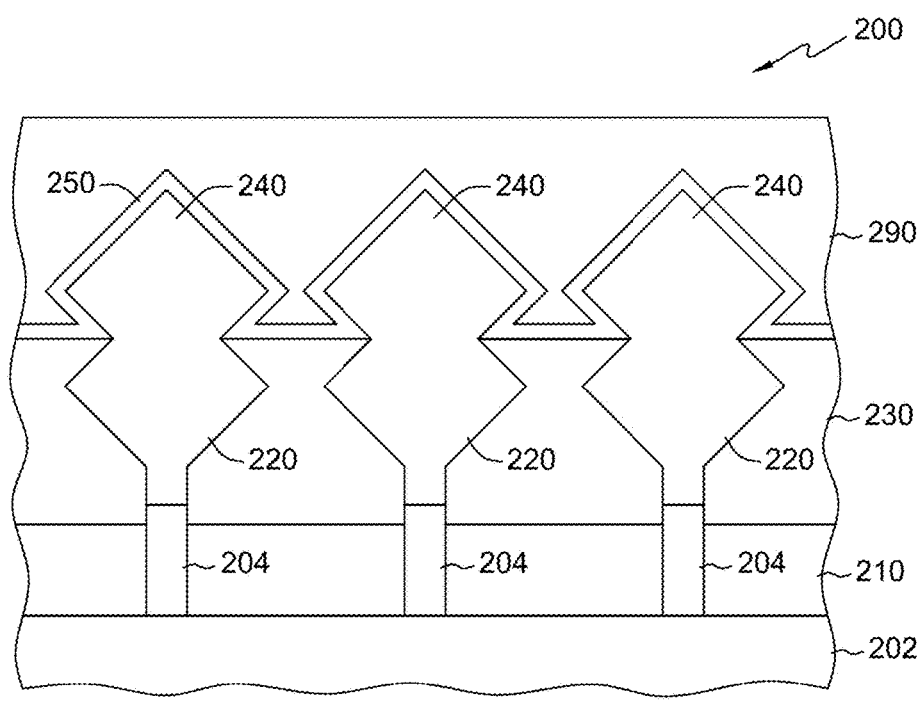
FIG. 8 depicts the structure of FIG. 7 after depositing at least one flowable oxide layer, in accordance with one or more aspects of the present invention.

As depicted in FIG. 8, after the deposition of the at least one barrier layer 250, at least one flowable oxide layer 290 may be deposited using any conventional deposition process, for example, CVD or flowable CVD. The at least one flowable oxide layer 290 may then be planarized by, for example, CMP or a poly open chemical planarization (POC).

After performing hard mask open and poly pull process and replacement metal gate process (RMG), at least one second ILD layer 260 may be deposited over the at least one barrier layer 250. Lithography may then be performed for contact formation.

Figure 9:
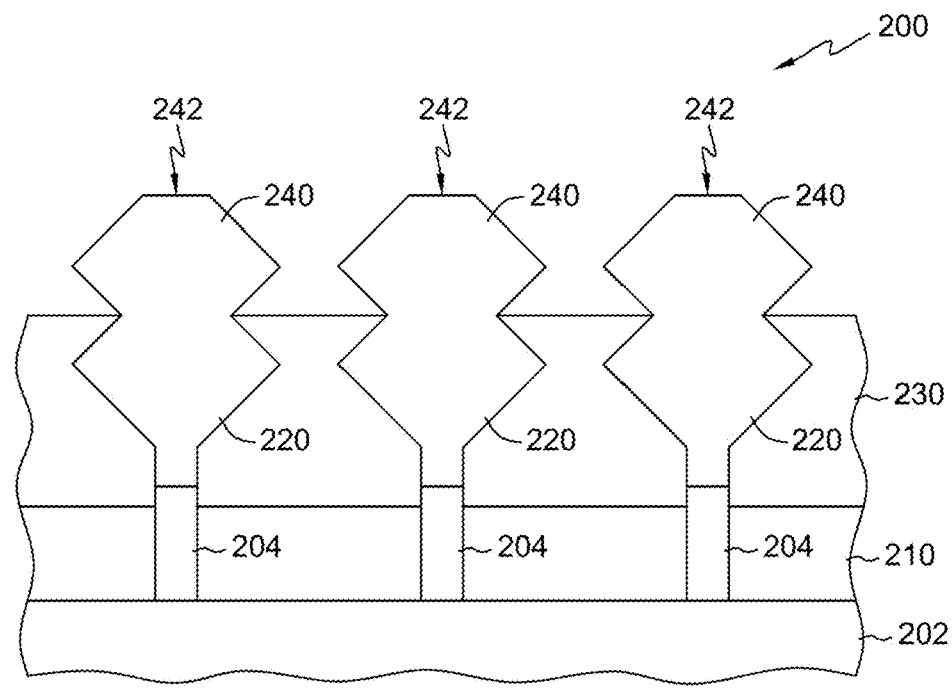
FIG. 9 depicts the structure of FIG. 8 after planarizing and etching to expose at least a portion of the at least one second layer of epitaxial growth, in accordance with one or more aspects of the present invention.
Figure 10:
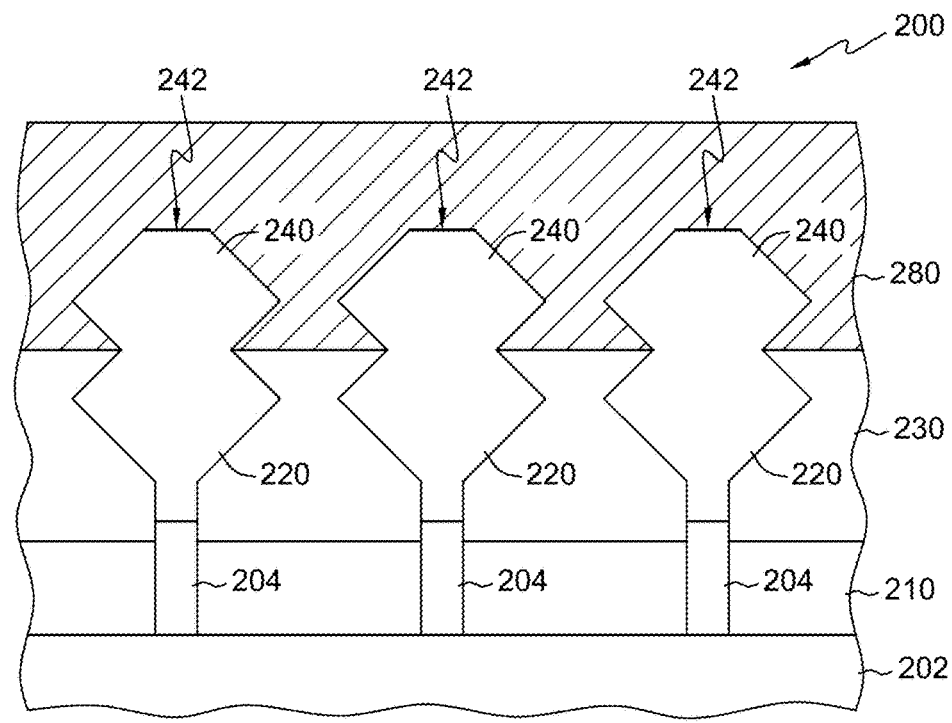
FIG. 10 depicts the structure of FIG. 9 after performing a contact formation process, in accordance with one or more aspects of the present invention.

Then, as depicted in FIG. 9, etching may be performed on the at least one second ILD layer 260, the at least one flowable oxide layer 290, and the at least one barrier layer 250 to expose at least a portion of the at least one second layer of an epitaxial growth 240. The planarization process may cause damage to the top portion 242 of the at least one second layer of epitaxial growth 240, such that the shape of the at least one second layer of epitaxial growth 240 is no longer substantially a diamond shape, as shown in FIGS. 9 and 10.

The contact formation process may then be performed to form the source and drain contacts. Then, as shown in FIG. 10, contact metal 280 may be formed.

Figure 11:
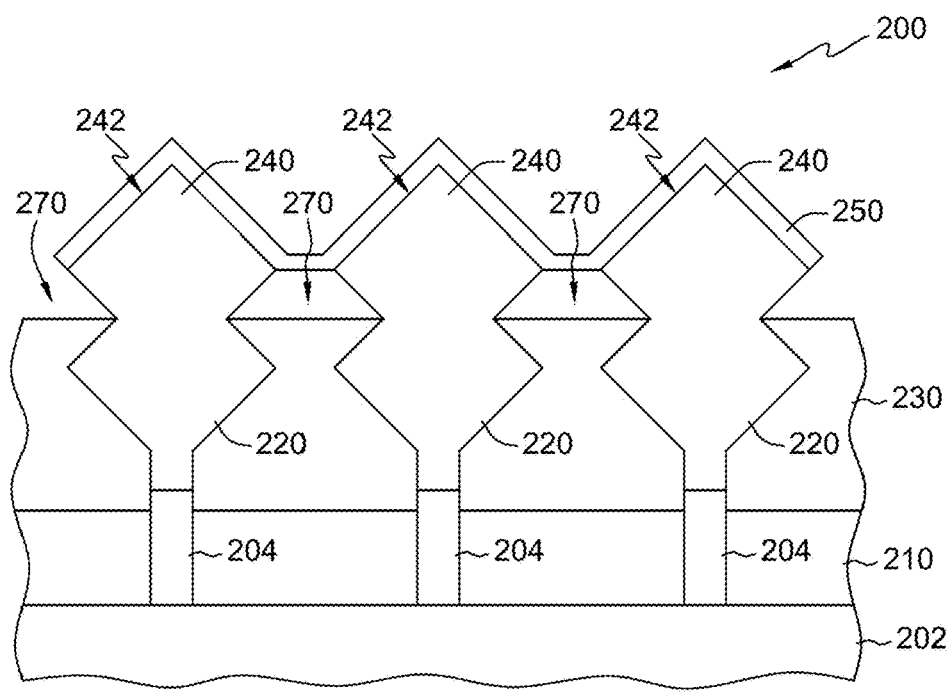
FIG. 11 depicts another embodiment of a method for growing unmerged epitaxy wherein an etch stop layer is deposited and air gaps are formed, in accordance with one or more aspects of the present invention.
Figure 12:
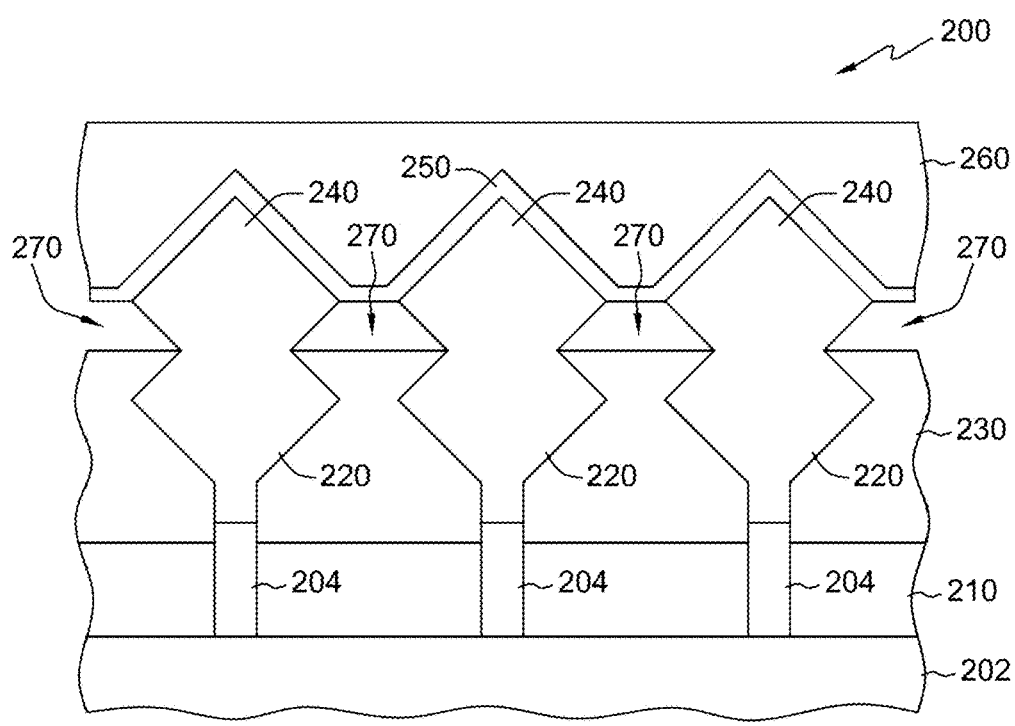
FIG. 12 depicts the structure of FIG. 11 after depositing an interlayer dielectric layer, in accordance with one or more aspects of the present invention.
Figure 13:
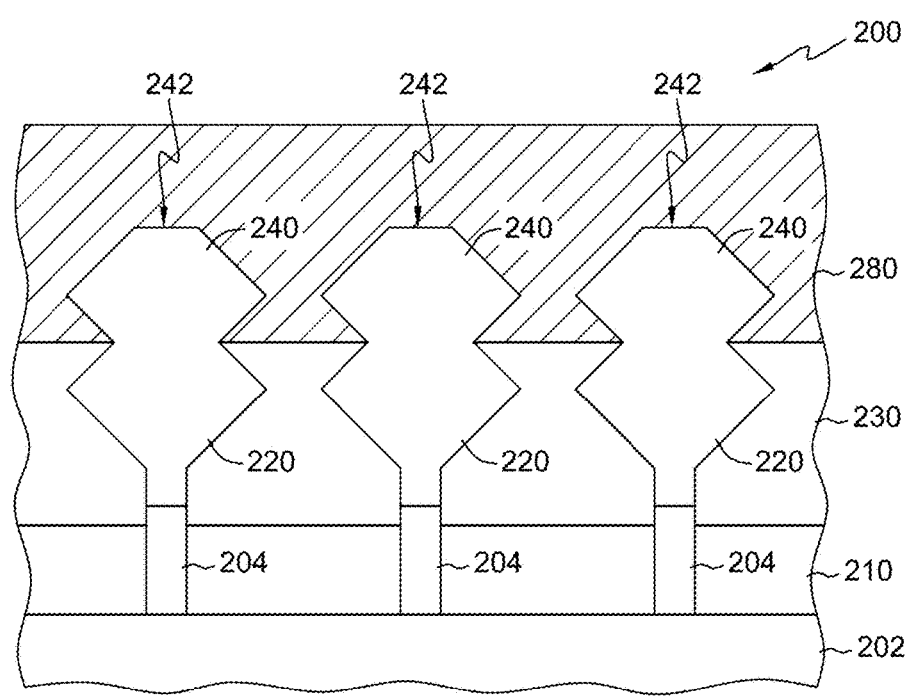
FIG. 13 depicts the structure of FIG. 12 after planarizing and etching to expose at least a portion of the at least one second layer of epitaxial growth, in accordance with one or more aspects of the present invention.

FIGS. 11-13 depict, by way of example only, an alternative embodiment of a portion of the FinFet device formation process of FIG. 1. Note again that these figures are not drawn to scale in order to facilitate understanding of the invention, and that the same reference numerals used throughout different figures designate the same or similar elements.

As depicted in FIG. 11, after the formation of at least one second layer of an epitaxial growth 240, at least one barrier layer 250 may be conformally deposited over the top portions 242 of the at least one second layer of an epitaxial growth 240, without depositing over the first ILD layer 230. For example, where the space between the at least one second layer of an epitaxial growth 240 and an adjacent at least one second layer of an epitaxial growth 240, measures less than 15 nm, the at least one barrier layer 250 may not pass through the space between the at least one second layer of an epitaxial growths 240 to form a layer on the first ILD layer 230, as shown in FIGS. 11 and 12. As another example, the at least one second layer of an epitaxial growth 240 may be formed to be larger than the first layer of an epitaxial growth 220, such that when the at least one barrier layer 250 is deposited, the at least one barrier layer 250, for example, blankets only the upper surfaces of the at least one second layer of an epitaxial growth 240 and does not pass between the epitaxial growth structures to form a layer on the first ILD layer 230. The at least one barrier layer 250 may be a contact etch stop layer, which may be comprised of silicon nitride ($Si_3N_4$) or low k material, i.e., SiCOH.

As depicted in FIGS. 11 and 12, the deposition of the at least one barrier layer 250 over the top portion 242 of the at least one second layer of an epitaxial growth 240, may create an air gap 270 in the space between the epitaxial growths 240. When air gaps 270 are present, less etching may be performed and less damage to the epitaxial growth structures may occur from planarizing and/or etching processes. In some instances, for example, when a wet etching process is performed to etch the first ILD layer, the air gaps 270 may be larger.

The at least one barrier layer 250 may be deposited using any conventional deposition process, for example, ALD, CVD, or PVD. The at least one barrier layer 250 may be a thin layer of, for example, 3 to 20 nm and more preferably 5 to 10 nm.

At least one second ILD layer 260 may be deposited over the at least one barrier layer 250, as shown in FIG. 12.

As depicted in FIG. 13, the at least one second ILD layer 260 may then be planarized by, for example, chemical mechanical planarization (CMP), and etching may be performed on the at least one second ILD layer 260 and the at least one barrier layer 250 to expose at least a portion of the at least one second layer of an epitaxial growth 240. The planarization process may cause damage to the top portions 242 of the at least one second layer of epitaxial growths 240, such that the shape of the of at least one second layer of epitaxial growths 240 are no longer substantially a diamond shape, as shown in FIG. 13.

The contact formation process may then be performed to form the source and drain contacts. Then, as shown in FIG. 13, contact metal 280 may be formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising:
    a device having at least one source, at least one drain, and at least one fin on a semiconductor layer;
    a first dielectric layer over the device and positioned around at least a portion of the at least one fin;
    a first layer of epitaxial growth on the at least one fin, the first layer of epitaxial growth including a first top surface, a first side surface extending away from the first top surface in a first direction at an angle toward the semiconductor layer, and a second side surface extending away from the first top surface in a second direction at an angle toward the semiconductor layer;
    second dielectric layer over the first dielectric layer, the second dielectric layer positioned around at least a portion of the first layer of epitaxial growth and at least a portion of the at least one fin;
    a second layer of epitaxial growth superimposing the first layer of epitaxial growth;
    a first contact region over the at least one source; and
    a second contact region over the at least one drain,
    wherein the second interlayer dielectric layer contacts the first side surface of the first layer of epitaxial growth and the second side surface of the first layer of epitaxial growth.

2. The structure of claim 1, wherein the first layer of epitaxial growth substantially takes on a shape of a diamond.

3. The structure of claim 1, wherein the second layer of epitaxial growth substantially takes on a shape of at least one of a diamond, a square, a rectangle, a pentagon, a trapezoid, and a polygon.

4. The structure of claim 1, wherein the second layer of epitaxial growth is one second layer of epitaxial growth.

5. The structure of claim 4, wherein the second layer of epitaxial growth extends away from the first top surface of the first layer of epitaxial growth.

6. The structure of claim 5, wherein the second layer of epitaxial growth comprises:
    a second top surface;
    a third side surface extending away from the second top surface in a first direction at an angle toward the semiconductor layer; and a fourth side surface extending away from the second top surface in a second direction at an angle toward the semiconductor layer.

7. The structure of claim 6, wherein the second layer of epitaxial growth further comprises:
   a fifth side surface extending from the third side surface of the second layer of epitaxial growth to a top of the first side surface of the first layer of epitaxial growth; and
   a sixth side surface extending from the fourth side surface of the second layer of epitaxial growth to a top of the second side surface of the first layer of epitaxial growth.

8. The structure of claim 7, wherein the first contact region or the second contact region contacts the second top surface, the third side surface, the fourth side surface, the fifth side surface, and the sixth side surface of the second layer of epitaxial growth.

9. The structure of claim 8, wherein the second top surface, the third side surface, the fourth side surface, the fifth side surface, and the sixth side surface of the second layer of epitaxial growth are positioned above the second dielectric layer.

10. The structure of claim 1, further comprising:
    a third layer of epitaxial growth.

11. The structure of claim 10, wherein the second layer of epitaxial growth extends away from the first top surface of the first layer of epitaxial growth, and the second layer of epitaxial growth comprises:
    a second top surface;
    a third side surface extending away from the second top surface in a first direction at an angle toward the semiconductor layer;
    a fourth side surface extending away from the second top surface in a second direction at an angle toward the semiconductor layer;
    a fifth side surface extending from the third side surface of the second layer of epitaxial growth to a top of the first side surface of the first layer of epitaxial growth; and
    a sixth side surface extending from the fourth side surface of the second layer of epitaxial growth to a top of the second side surface of the first layer of epitaxial growth.

12. The structure of claim 11, wherein the third layer of epitaxial growth extends away from the second top surface of the second layer of epitaxial growth, and the third layer of epitaxial growth comprises:
    a third top surface;
    a seventh side surface extending away from the third top surface in a first direction at an angle toward the semiconductor layer; and
    an eighth side surface extending away from the second top surface in a second direction at an angle toward the semiconductor layer.

13. The structure of claim 12, wherein the third layer of epitaxial growth further comprises:
    a ninth side surface extending from the seventh side surface of the third layer of epitaxial growth to a top of the third side surface of the second layer of epitaxial growth; and
    a tenth side surface extending from the eighth side surface of the third layer of epitaxial growth to a top of the fourth side surface of the second layer of epitaxial growth.

14. The structure of claim 13, wherein the first contact region or the second contact region contacts the third side surface, the fourth side surface, the fifth side surface, and the sixth side surface of the second layer of epitaxial growth and the third top surface, seventh side surface, eighth side surface, ninth side surface, and tenth side surface of the third layer of epitaxial growth.

15. The structure of claim 14, wherein the third top surface, seventh side surface, eighth side surface, ninth side surface, and tenth side surface of the third layer of epitaxial growth are positioned above the second dielectric layer.

* * * * *